(12) United States Patent
Czamara et al.

(10) Patent No.: US 8,154,870 B1
(45) Date of Patent: Apr. 10, 2012

(54) AIR DIRECTING DEVICE FOR RACK SYSTEM

(75) Inventors: Michael P. Czamara, Seattle, WA (US); Osvaldo P. Morales, Seattle, WA (US); Thomas M. Nalley, Loudoun, VA (US)

(73) Assignee: Amazon Technologies, Inc., Reno, NV (US)

( * ) Notice: Subject to any disclaimer, the term of this patent is extended or adjusted under 35 U.S.C. 154(b) by 183 days.

(21) Appl. No.: 12/646,417

(22) Filed: Dec. 23, 2009

(51) Int. Cl.
*H05K 7/20* (2006.01)

(52) U.S. Cl. ..................... 361/694; 361/695; 454/184

(58) Field of Classification Search .................. None
See application file for complete search history.

(56) References Cited

U.S. PATENT DOCUMENTS

| | | | |
|---|---|---|---|
| 6,141,986 A | 11/2000 | Koplin | |
| 6,459,579 B1 | 10/2002 | Farmer et al. | |
| 6,859,366 B2 | 2/2005 | Fink | |
| 6,960,130 B2 | 11/2005 | Gebke et al. | |
| 7,010,392 B2 | 3/2006 | Bash et al. | |
| 7,031,154 B2 * | 4/2006 | Bash et al. | 361/690 |
| 7,197,433 B2 | 3/2007 | Patel et al. | |
| 7,257,956 B2 | 8/2007 | Shimada et al. | |
| 7,278,273 B1 | 10/2007 | Whitted et al. | |
| 7,283,358 B2 * | 10/2007 | Campbell et al. | 361/694 |
| 7,804,685 B2 | 9/2010 | Krietzman | |
| 7,869,210 B2 * | 1/2011 | Moss | 361/694 |
| 2004/0218355 A1 * | 11/2004 | Bash et al. | 361/690 |
| 2005/0228618 A1 | 10/2005 | Patel et al. | |
| 2005/0237716 A1 * | 10/2005 | Chu et al. | 361/696 |
| 2007/0101746 A1 | 5/2007 | Schlom et al. | |
| 2008/0029250 A1 | 2/2008 | Carlson et al. | |
| 2008/0055846 A1 | 3/2008 | Clidaras et al. | |
| 2008/0094797 A1 | 4/2008 | Coglitore et al. | |
| 2008/0259566 A1 | 10/2008 | Fried | |
| 2008/0285232 A1 * | 11/2008 | Claassen et al. | 361/694 |
| 2009/0061755 A1 | 3/2009 | Calder et al. | |
| 2010/0149754 A1 | 6/2010 | Chapel et al. | |

OTHER PUBLICATIONS

U.S. Appl. No. 11/535,180.
U.S. Appl. No. 12/341,137, filed Dec. 28, 2008.
U.S. Appl. No. 11/956,849, filed Dec. 14, 2007.
U.S. Appl. No. 12/163,146, filed Jun. 27, 2008.

* cited by examiner

*Primary Examiner* — Gregory Thompson
(74) *Attorney, Agent, or Firm* — Robert C. Kowert; Meyertons, Hood, Kivlin, Kowert & Goetzel, P.C.

(57) ABSTRACT

A computing system includes a rack system that allows air to flow into the rack system on a first side of the rack system and to discharge from the rack system on a second side of the rack system. One or more air directing devices are coupled to the rack system on the first side of the rack system or the second side of the rack system. At least one of the air directing devices includes a duct having an upwardly increasing interior cross section over at least a portion of the height of the duct. The duct segregates air passing through the duct from air outside the duct. The air directing device may include a louver that couples to the rack system. The louver may include one or more airflow control members that allow air to pass through the louver.

34 Claims, 12 Drawing Sheets

AIR DIRECTING DEVICE FOR RACK SYSTEM

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some known data centers include methods and apparatus that facilitate waste heat removal from rack systems. Moreover, some known data centers include a multiple rack systems having configurations that are non-uniform with respect to component density and usage, such that each rack system generates waste heat at a non-uniform rate as compared to other rack systems. In such data centers, application of uniform heat removal methods and apparatus to such non-uniform waste heat generation sources may not be fully efficient and effective in waste heat removal. Moreover, if rack systems having different airflow arrangements are placed near each other (next to one another in the same row, for example), heated discharge air from some of the racks may cross-heat incoming air to other rack systems, adversely affecting cooling of the other rack systems in a row. For example, if Rack A in a row of racks discharges air heated air to the back of the row, and adjacent Rack B in the same row draws in ambient air at the back of the row to cool servers in Rack B, the discharge air from Rack A will pre-heat the air being drawn into Rack B, thereby reducing cooling effectiveness for Rack B.

In many computer rooms, cooling air carrying waste heat from the rack systems is discharged from the rack systems to the room ambient air above the rack systems. At the same time, an air handling system for the room draws the heated air out of the room through vents in the ceiling or walls of the room, thereby maintaining a steady-state flow of air in the room. Before the discharged air carrying the waste rack system reaches the vents, however, the exit air from the rack systems mixes with the room ambient air. Some of the waste heat from the discharged air is transferred into the room ambient air, which causes the ambient temperature in the room to rise and may create short-cycling and other inefficiencies in cooling of the rack systems.

Figure 1:
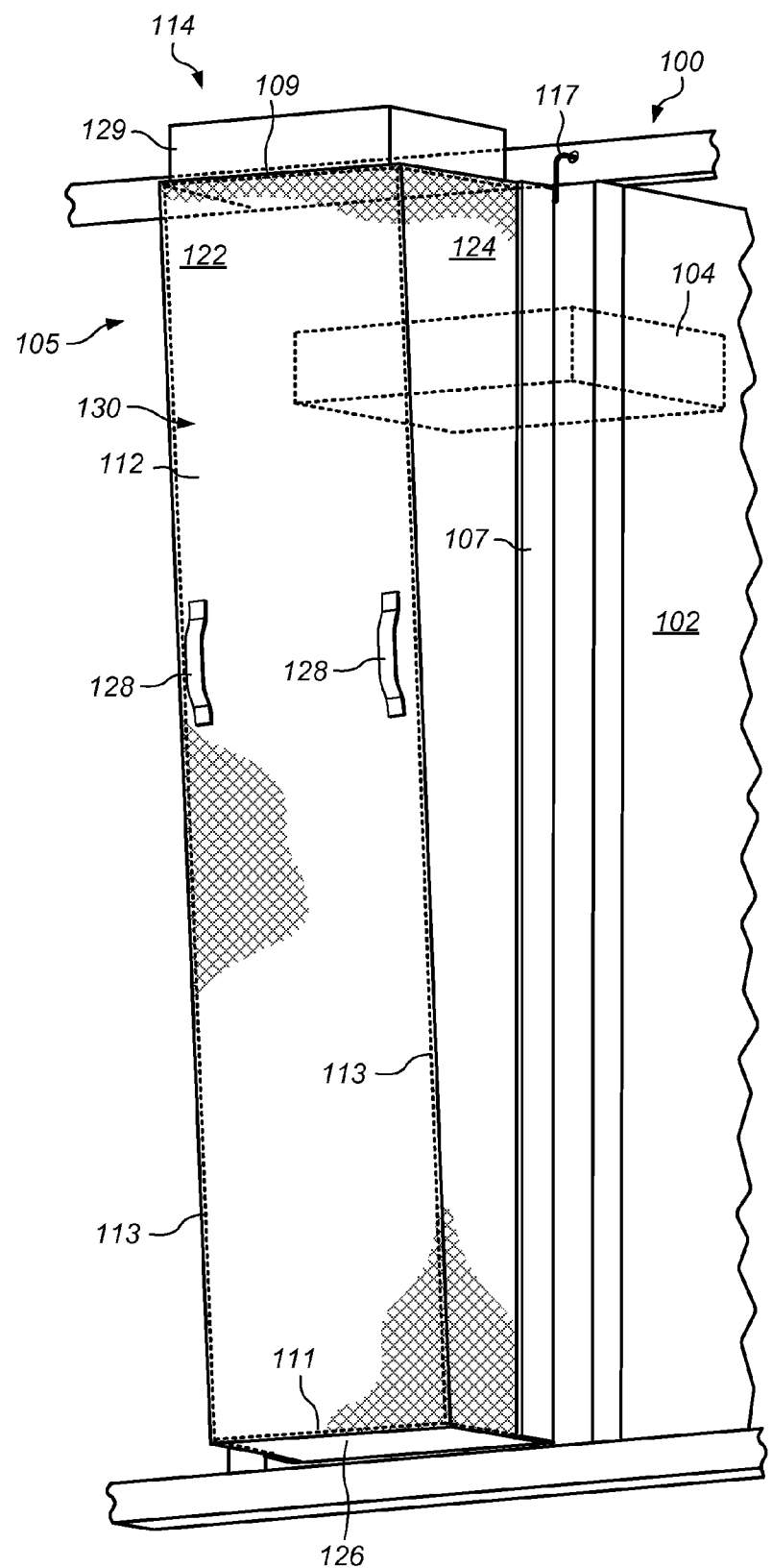
FIG. 1 illustrates an air directing device for directing air out of, or into, a rack system according to one embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of air directing devices, and systems and methods using air directing devices, are disclosed. According to one embodiment, a computing system includes a rack system having one or more computer systems. The rack system allows air to flow into the rack system on a first side of the rack system and allows air to discharge from the rack system on a second side of the rack system. One or more air directing devices are coupled to the rack system on the first side of the rack system or the second side of the rack system. At least one of the air directing devices includes a duct having an upwardly increasing interior cross section over at least a portion of the height of the duct. The duct segregates air passing through the duct from air outside the duct. In certain embodiments, portions of a duct are made of fabric.

According to one embodiment, an air directing device for directing air from or to a rack system includes a louver that couples to the rack system and a duct coupled to the louver. The louver includes one or more airflow control members that can allow air to pass through the louver. The duct segregates air passing through the duct from air outside the duct.

According to one embodiment, a data center includes a rack row including two or more rack systems including at least one computer system. An air handling systems moves air through rack systems in the row. When the air handling system is operated, at least one of the rack systems in the row draws air from an aisle on one side of the row, while at least one other rack system in the row discharges air on the same side. An air directing device is coupled to at least one of the rack systems. The air directing device segregates air discharged on the first side of row from air in the aisle on the first side of the rack.

According to one embodiment, a method of cooling rack systems in a computer room of a data center includes providing an air directing device on a first side of a row of rack systems in the computer room. Air is drawn from an aisle on the first side of the row into at least one rack system in the row. Air is discharged from at least one rack system in the row into the air directing device.

As used herein, "air handling system" means a system that provides or moves air to, or removes air from, one or more systems or components.

As used herein, an "aisle" means a space next to one or more racks.

As used herein, "ambient" refers to a condition of outside air at the location of a system or data center.

As used herein, "computing" includes any operations that can be performed by a computer, such as computation, data storage, data retrieval, or communications.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, a "duct" includes any device, apparatus, element, or portion thereof, that can direct, segregate, or channel a fluid, such as air. Examples of ducts include cloth or fabric ducts, sheet metal ducts, molded ducts, tubes, or pipes. The cross sectional shape of a passageway of a duct may be square, rectangular, round or irregular, and may be uniform or change over the length of the duct. A duct may be a separately produced component or integral with one or more other components, such as a frame.

As used herein, a "free cooling" includes operation in which an air handling system pulls air at least partially from an external source (such as air outside a facility) and/or a return from a computer room, and forces the air to electronic equipment without active chilling in the air-handling sub-system (e.g., fluid flow through the chiller coils in the air handling sub-system is shut off by closing a flow control valve).

As used herein, a "louver" includes any device, apparatus, element, or portion thereof, having one or more slats, fins, vanes, panels, or other airflow control members that control or regulate passage of air through one or more slots or other openings. A louver may include, for example, a set of mutually parallel, horizontal fins. Airflow control members of a louver may be adjustable, fixed, or a combination thereof.

As used herein, a "rack" means a rack, container, frame, or other element or combination of elements that can contain or physically support one or more computer systems.

As used herein, a "pin" includes any element that can be positioned to constrain or hold another element in a desired position or orientation. Suitable pins may include straight pins, pegs, threaded bolts, unthreaded bolts, bars, plates, hooks, rods, or screws.

As used herein, a "space" means a space, area or volume.

FIG. 1 illustrates an air directing device for directing air out of, or into, a rack system according to one embodiment. Rack system 100 includes rack 102 and servers 104 (for clarity, only one server 104 is shown in FIG. 1). Air directing device 105 is coupled to rack 102.

Air directing device 105 includes duct 112 and vent 114. J-hooks 117 are provided on frame 107 to couple frame 107 of duct 112 to rack system 102.

Duct 112 includes end panel 122, side panels 124, and bottom panel 126, handles 128, and tap-in collar 129. Tap-in collar 129 may be used to connect air directing device 108 with an external duct. End panel 122, side panels 124, and bottom panel 126 define passage 130. Passage 130 may receive air from rack system 100. Passage 130 may direct air received from rack system 100 to upper vent 114.

In some embodiments, duct 112, or portions thereof, is made of flexible or pliable material, such as foil or cloth. In one embodiment illustrated in FIGS. 1-3, the panels of duct 112 are made of fabric. Examples of suitable materials for a fabric may include a polyester, nylon, or cotton weave of yarn or filaments. In certain embodiments, cloth or fabric portions of a duct may be attached directly to rack system 102 (or to an intermediate frame such as frame 107) by way of hook and loop, snaps, screws, clips, or other fasteners.

Duct 112 includes upper boning 109, lower boning 111, and vertical boning 113. Upper boning 109, lower boning 111, and vertical boning 113 may be any of various structural members such as rods, bars, mesh, or strips. In certain embodiments, boning may be embedded into portions of duct 112. For example, boning elements may be sewn into fabric portions of duct 112.

Upper boning 109, lower boning 111, and vertical boning 113 may be sufficiently rigid to at least partially establish a shape of duct 112 when installed on rack 102. For example, upper boning 109 may establish a depth and width of duct 112 at the top of duct 112. Lower boning 111 may establish a depth and width of duct 112 at the bottom of duct 112. Vertical boning 113 may establish a profile shape of end panel of end panel 122. For example, vertical boning 113 may establish a linear taper from the top of duct 112 to the bottom of duct 112.

Figure 4:
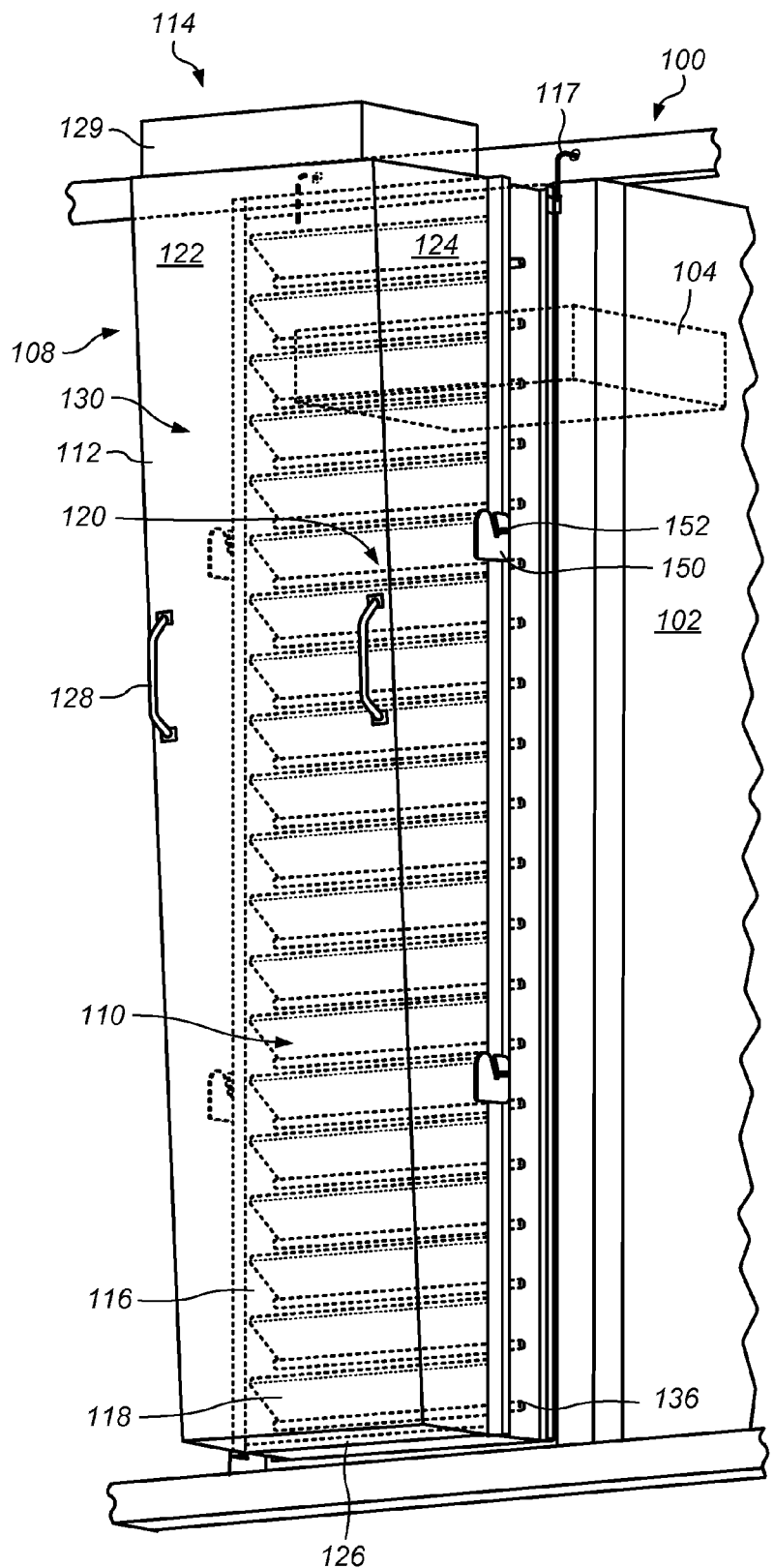
FIG. 4 illustrates an air directing device having a louver according to one embodiment.
Figure 5:
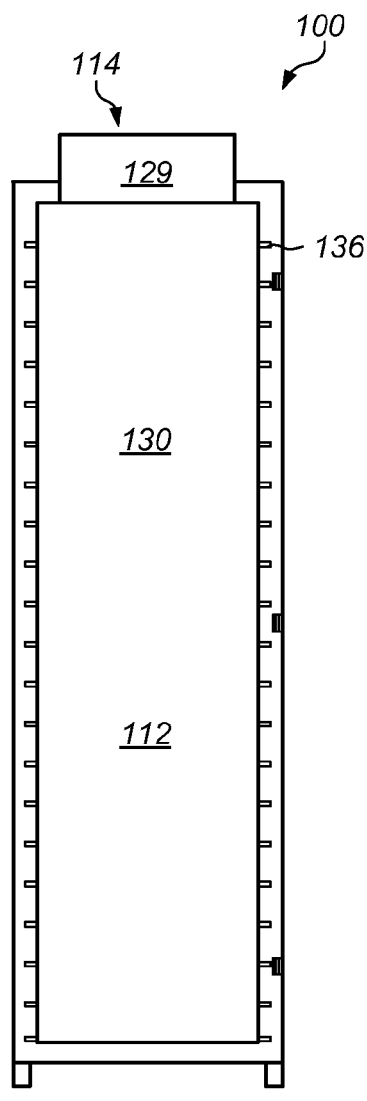
FIG. 5 is a schematic end view of a rack system with an air directing device having a louver.
Figure 6:
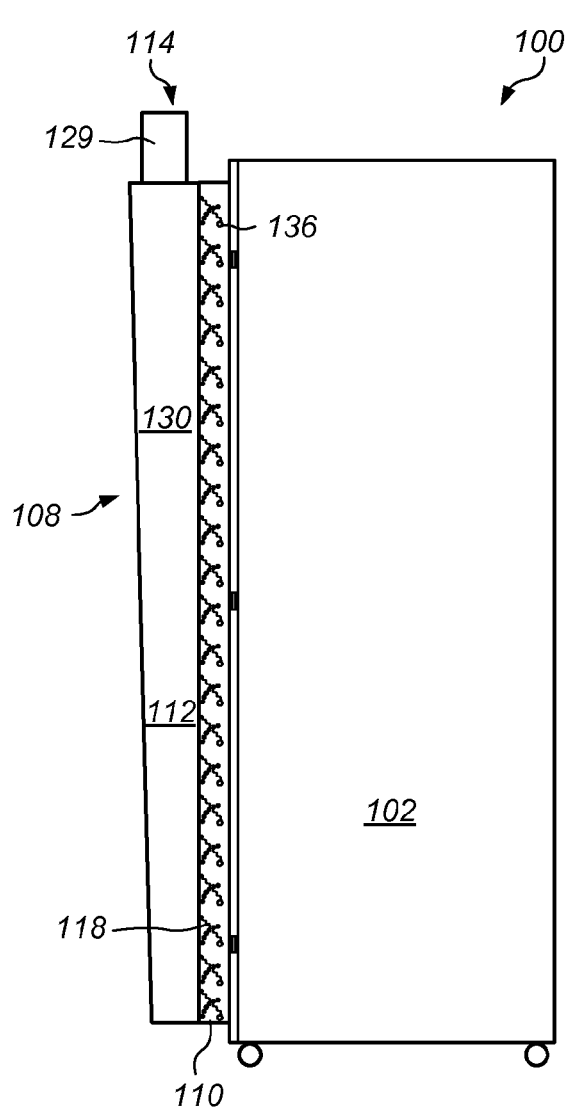
FIG. 6 is a schematic side view of a rack system with an air directing device having a louver.

Although in FIGS. 4, 5, and 6, boning is illustrated near the edges of the panels of duct 112, in other embodiments, a duct may include boning within the various panels. For example, boning may include a series of horizontal ribs, a series of vertical spines, a grid, or crossing members. In some embodiments, boning of a duct (such as upper boning 109 and/or lower boning 111) may be tied to a frame of the duct (such as frame 107 of duct 112).

Figure 2:
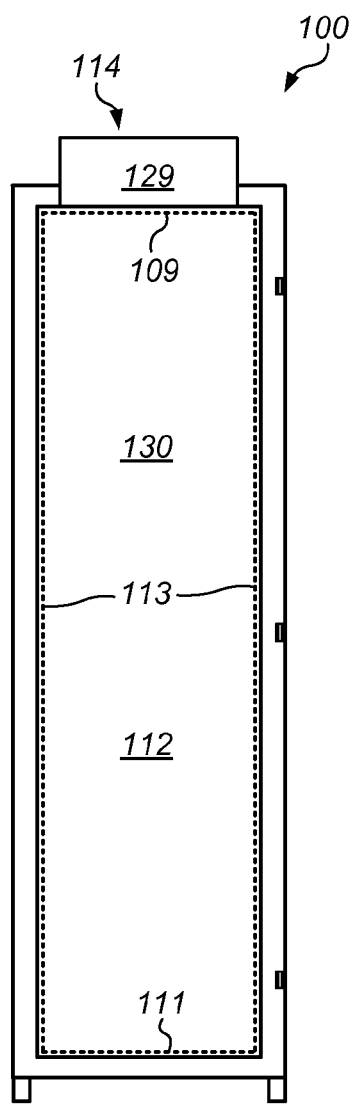
FIG. 2 is a schematic end view of a rack system with an air directing device.

Although in the embodiment shown in FIG. 2, duct 105 is shown as being made of fabric, in other embodiments, various other materials may be used. Suitable materials for a duct may include, for example, metal (such as sheet metal) or polymer. In one embodiment, a duct is 6061 aluminum alloy. In some embodiments, a duct is produced as a single part, such as by molding, forming, or machining. In other embodiments, a duct is an assembly of two or more parts, such as aluminum sheets. In certain embodiments, a duct includes thermal insulation.

Figure 3:
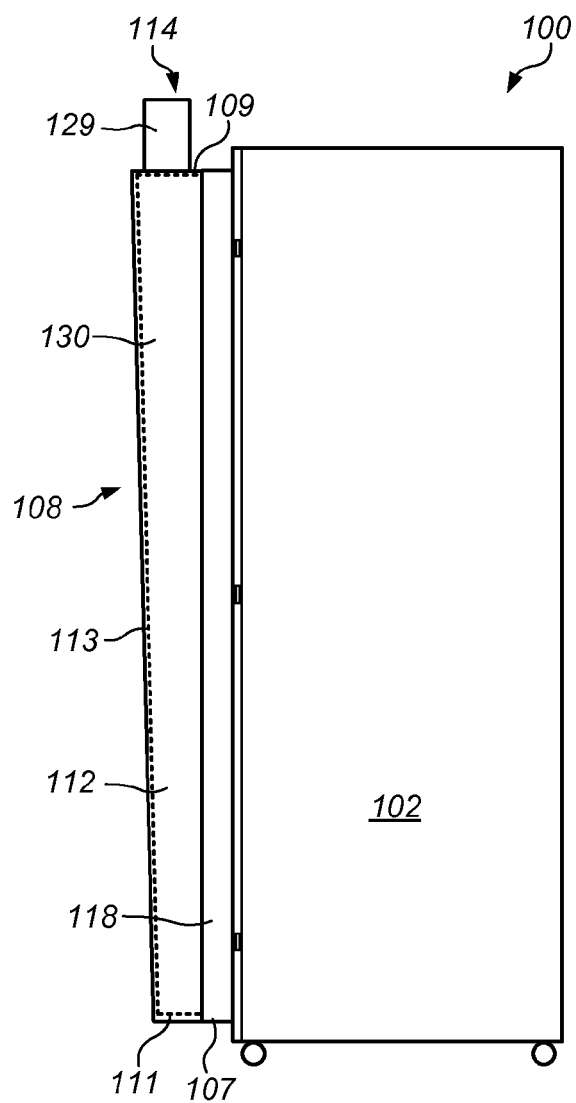
FIG. 3 is a schematic side view of a rack system with an air directing device.

In some embodiments, a rack system includes an air directing device with a duct having an interior cross section that is upwardly increasing (for example, tapering) over at least a portion of the height of the duct. FIG. 2 illustrates an end view of a rack system with an air directing device. FIG. 3 illustrates a side view of the rack system shown in FIG. 2. End panel 122 has a slanted orientation such that the horizontal cross sectional area of passage 130 increases upwardly. A passage having an upwardly increasing cross section may promote the flow of air in passage 130 upward and out vent 114. In certain embodiments, a passageway in an air directing device may produce a chimney effect, thereby promoting a flow of exit cooling air from a rack system. In some embodiments, the passage of air from the duct into an overhead discharge plenum above the ceiling line may further promote the flow of air from a rack system.

In some embodiments, the ratio of the cross sectional area at the top of passage 130 to the cross sectional area at the bottom of passage 130 is about 2:1, plus or minus about 0.5. In some embodiments, the ratio of the depth of passage 130 at the top of passage 130 to the depth of passage at the bottom of passage 130 is about 2:1, plus or minus about 0.5. In one embodiment, the depth of duct 112 at the lower end of duct 112 is about 4.25 inches, and the depth of duct 112 at the upper end of duct 112 is about 8.25 inches. In another embodiment, a duct having a height of 73.5 inches has a depth at the bottom of the duct of 4 inches and a depth at the top of the duct of 6 inches.

In some embodiments, an air directing device may include a louver. FIG. 4 illustrates an air directing device with a louver. Air directing device 108 includes louver 110, duct 112, and vent 114. Louver 110 includes frame 116 and airflow control members 118. Openings 120 are defined between adjacent airflow control members 118. Airflow control members 118 may be movably coupled to frame 120. In certain embodiments, one or more of airflow control members may be in a fixed relation to frame 112. In the embodiment shown in FIG. 4, airflow control members 118 are parallel slats. A louver of an air directing device may, however, have airflow control members in various other shapes, sizes, and arrangements. J-hooks 117 are provided on frame 116 to couple louver 110 to rack system 102.

Air directing device 108 may control flow of air exiting from rack 102. In some embodiments, airflow control members 118 of louver 110 inhibit backflow of air from air directing device 108 into rack 102.

Figure 7:
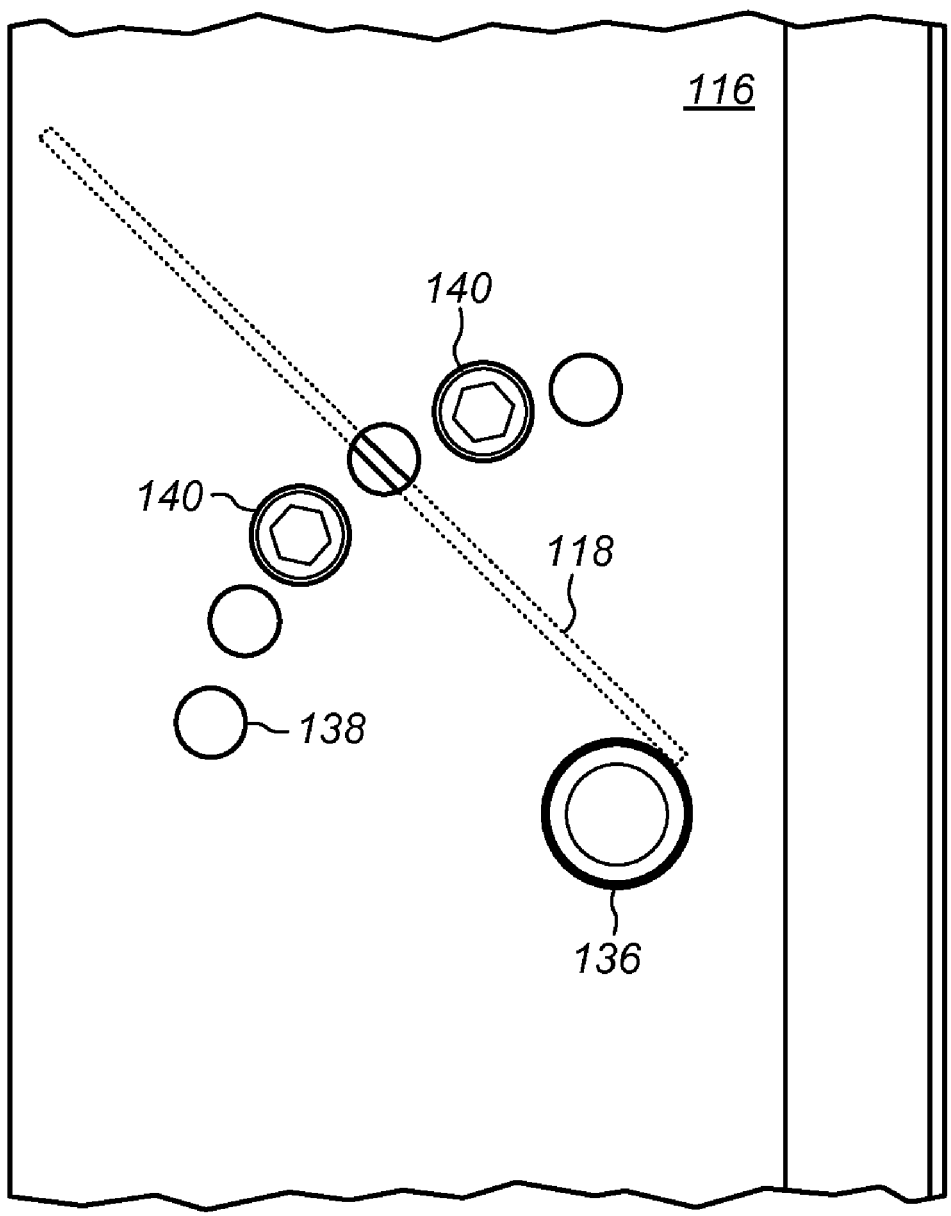
FIG. 7 illustrates an apparatus for adjusting the position of airflow control members.

In some embodiments, airflow control members may be individually adjustable. For example, each of airflow control members 118 shown in FIG. 4 may be individually adjustable. FIG. 7 illustrates one apparatus for adjusting the position of airflow control members. Airflow control member 118 is attached to frame 116 by way of pins 136. Airflow control member 118 rotates on pins 136 relative to frame 116. Frame 116 includes an array of holes 138. A pair of bolts 140 may be installed in holes on either side of airflow control member 118. The distal portion of bolts 140 may extend along side a portion of flow control member 118 to hold flow control member 118 in a desired position. To adjust airflow control member 118, bolts 140 may be uninstalled, airflow control member 118 may be rotated on pins 136 to a new position, and bolts 140 may be reinstalled to hold airflow control member 118 at the new position. In some embodiments, an airflow control member may be adjustable between about 0 and 180 degrees.

Although in the embodiment shown in FIG. 7, bolts are used to constrain airflow control members, any of a variety of components may be used as pins to constrain an airflow control member.

In certain embodiments, two or more airflow control members may be adjusted by a common mechanism. For example, all the airflow control members corresponding to a particular slot in a rack may be commonly controlled with a single mechanism.

The position of airflow control members in a louver of an air directing device may be controlled automatically, manually, or a combination thereof. In certain embodiments, a control system includes at least one programmable logic controller. The PLC may receive measurements of conditions in the air directing device or at other locations in a data center. In one embodiment, the PLC receives data from a flow sensor that measures airflow in an air directing device. Based on sensor data, the PLC may open and close airflow control members of a louver in the air directing device, as appropriate for the prevailing operational conditions. Alternatively, the PLC may modulate airflow control members between fully open and fully closed positions to modulate airflow, as appropriate for the prevailing operational conditions.

Although in the embodiments shown in FIGS. 4, 5, and 6, air directing device includes louver 110, in certain embodiments, louver 110 may be omitted.

Figure 8:
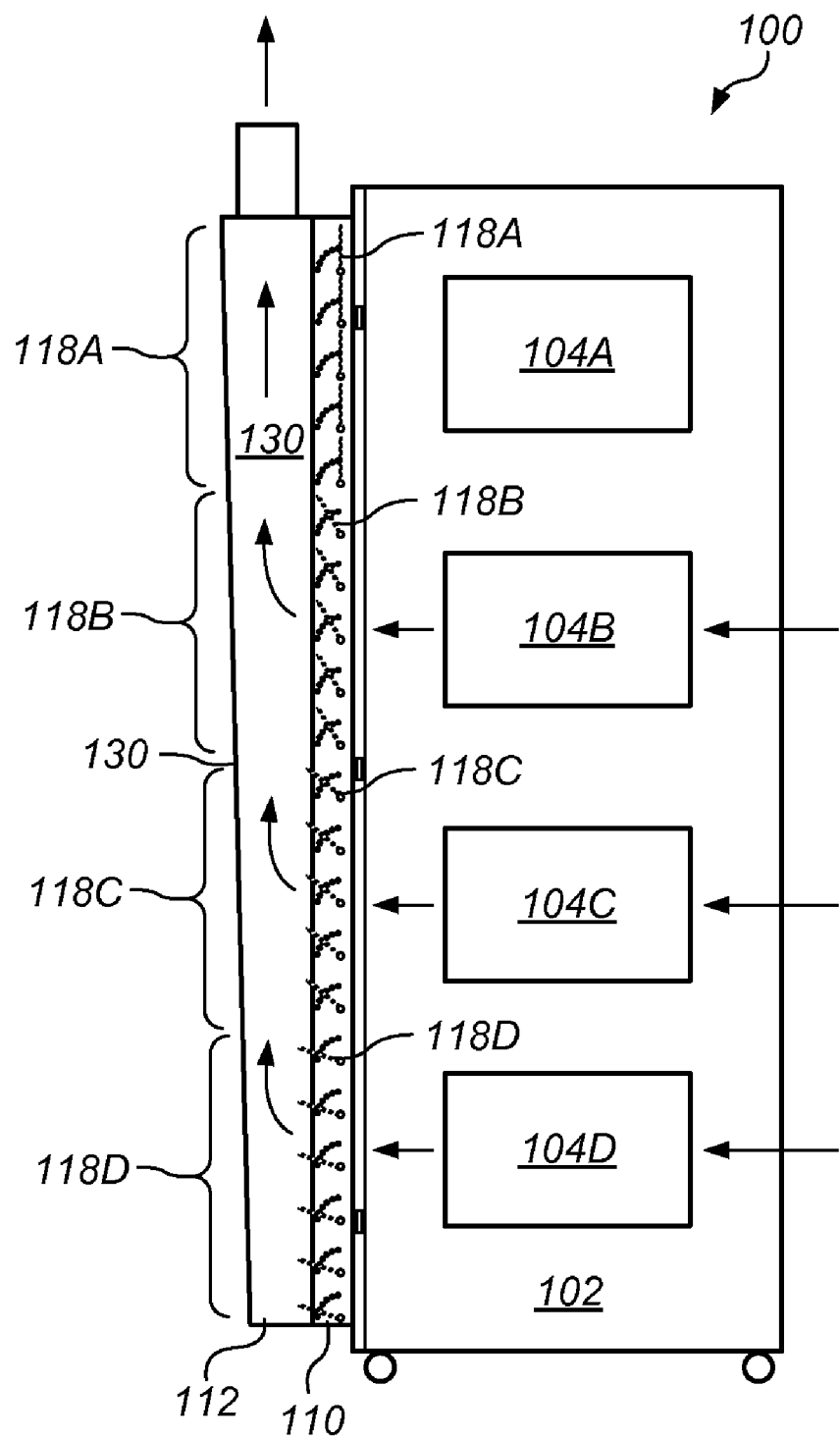
FIG. 8 is a schematic view of one embodiment of a rack system having servers with corresponding sets of airflow control members.

In some embodiments, different airflow control members in an air directing device are selectively positioned to tune airflow in a rack system. In some embodiments, sets of one or more airflow control members correspond to vertical positions in a rack system. FIG. 8 is a schematic view of one embodiment of a rack system having servers with corresponding sets of airflow control members. Rack system 100 includes rack 102 and servers 104A, 104B, 104C, and 104D. Air directing device 108 includes louver 110 and duct 112. Louver 110 includes sets of airflow control members 118A, 118B, 118C, and 118D. Set 118A vertically corresponds to server 104A, set 118B vertically corresponds to server 104B, set 118C vertically corresponds to server 104C, and set 118D vertically corresponds to server 104D. Each of sets 118A, 118B, 118C, and 118D may be adjusted to a different angle so as to vary the flow of air through openings in the louver. In certain embodiments, each airflow control member may be individually adjusted to a different angle.

In some embodiments, airflow control members may be adjusted to inhibit backflow to a rack system. In certain embodiments, airflow control members near the top of a rack system may be placed in a relatively more closed position than sets of louvers near the bottom of the rack. Closing airflow control members near the top portion of a rack system may keep warm air that has been introduced at the bottom of a duct from re-entering a rack system as the air rises toward the top of the air directing device. For example, as shown in FIG. 8, sets 118D, 118C, 118B, and 118A are progressively more closed from the bottom of rack system 100 to the top of rack system 100. Heated air from servers 104C and 104D may be introduced into passage 130 through sets 118C and 118D of airflow control members 118 and rise through passage 130. Sets 118A and 118B may keep warmed air in passage 130 from flowing back into rack system 100 as it rises in passage 130.

In some embodiments, some or all of the airflow control members in an air directing device are tuned based on the amount of airflow needed for different servers in a rack system. For example, if server 104D dissipates a relatively large amount of power, corresponding set 118D of airflow control members may be adjusted to a relatively open position, as shown in FIG. 8, such that a relatively large airflow rate through server 104D is achieved. Conversely, if server 104D dissipates a relatively small amount of power, set 118D may be adjusted to a relatively closed position, such that a relatively small airflow rate through server 104D is achieved. In one embodiment, a set of airflow control members may be entirely closed such that the set of airflow control members functions as a blanking plate (for example, if the slot in which server 104A is shown were empty or holds a component that does not produce heat).

Figure 9:
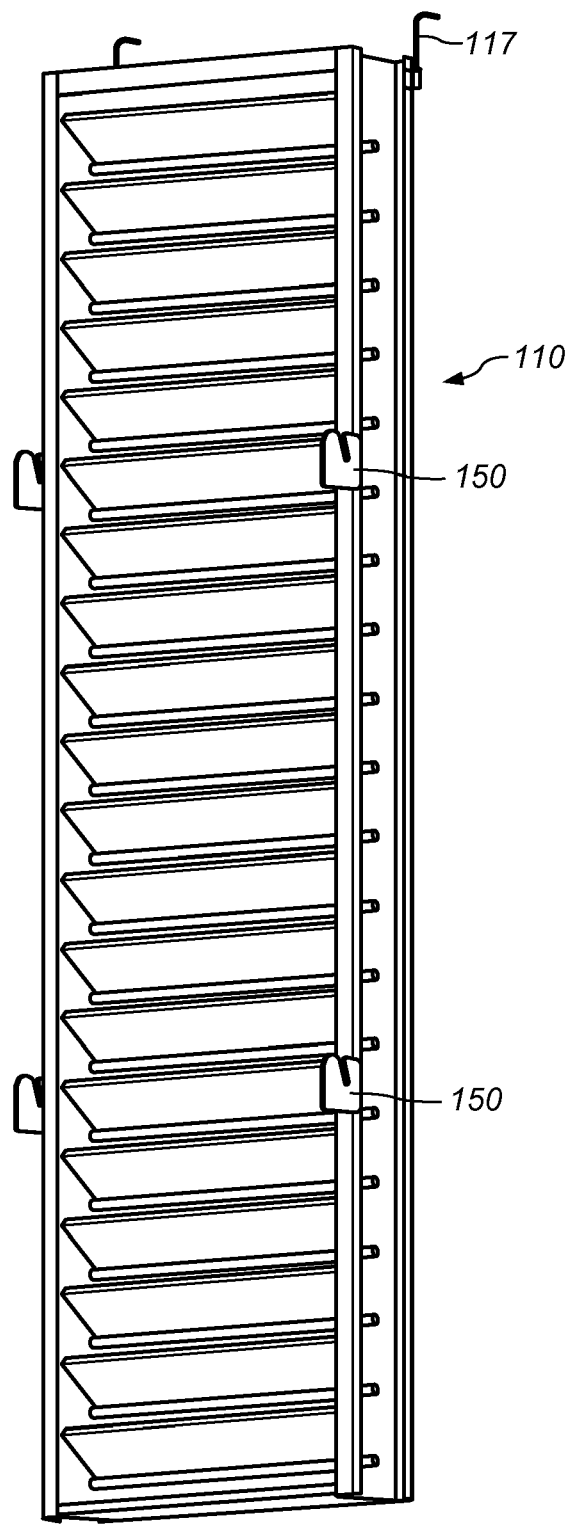
FIG. 9 illustrates an air directing device in which a duct has been removed from a louver.

In some embodiments, a duct may be removable from a louver. Having a removable duct allows a louver and duct to be installed and removed one part at a time. A removable duct 112 may also allow for maintenance of the rack system 102 and/or louver 110. FIG. 9 illustrates one embodiment of air directing device in which a duct has been removed from a louver. Louver 110 includes hooks 150. Duct 112 may includes pegs 152 (shown in FIG. 4). Pegs 152 may engage on hooks 150, such that duct 112 is supported on louver 110. In an alternate embodiment, a duct may be hinged to the frame of a louver, for example, along the top, bottom, or a side of the frame.

Figure 10A:
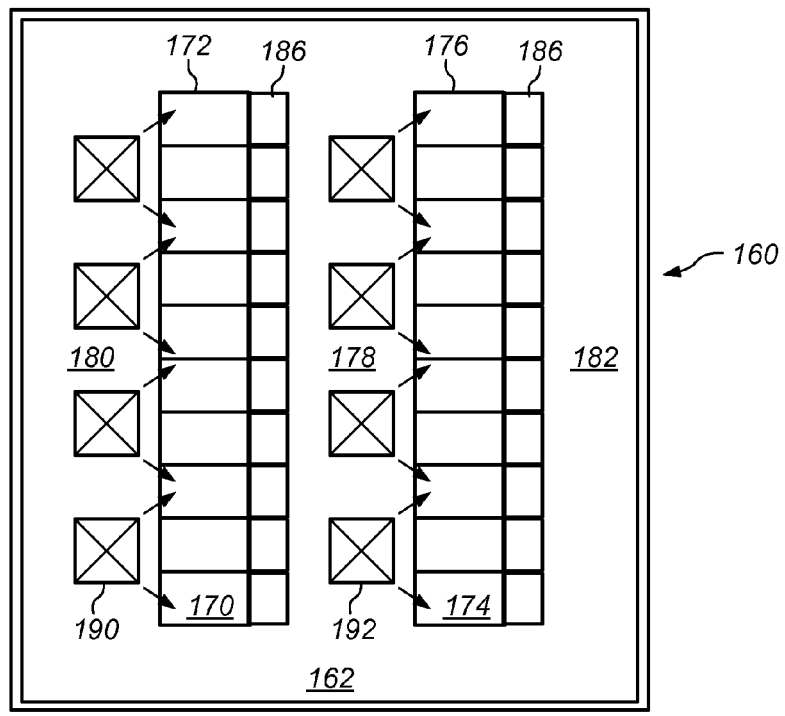
FIG. 10A is a schematic top view illustrating one embodiment of a data center including rows of rack systems with air directing devices.
Figure 10B:
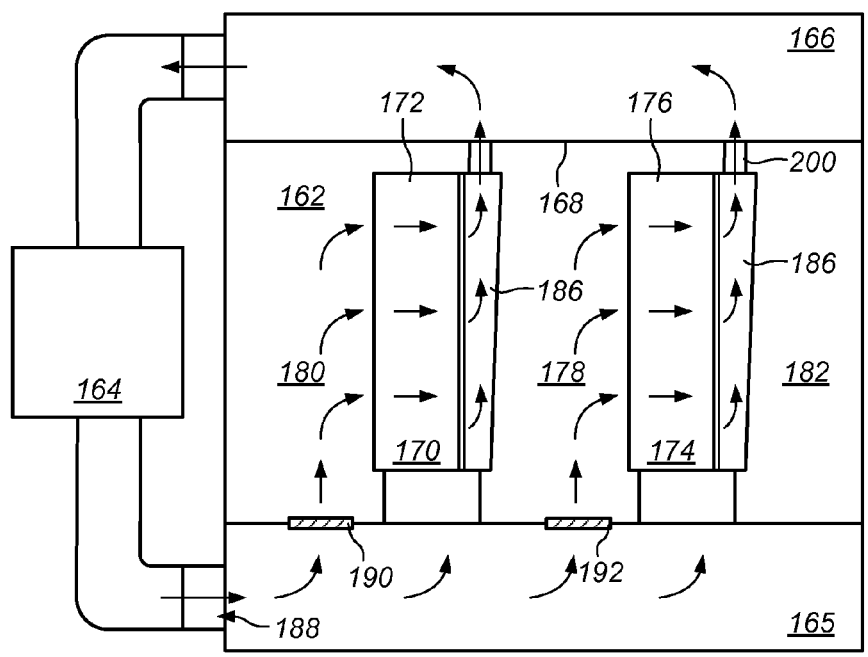
FIG. 10B is a schematic end view illustrating one embodiment of a data center including rows of rack systems with air directing devices.

In some embodiments, a data center having multiple rack systems includes air directing devices on some or all of the rack systems. The air directing devices may segregate air entering or exiting some of the rack systems from air spaces in the data center and/or air passing through other rack systems in the data center. In some embodiments, an air directing device segregates air exiting a rack system in a row of a rack systems from air in an aisle adjacent to the row. FIG. 10A illustrates a schematic top view of one embodiment of a data center including rows of rack systems with air directing devices. FIG. 10B illustrates a schematic end view of the data center shown in FIG. 10A. Data center 160 includes computer room 162, air handling system 164, subfloor chamber 165, and plenum 166. Plenum 166 is above ceiling 168 of computer room 162.

Computer room 162 includes rack systems 170 in row 172, and rack systems 174 in row 176. Aisle 178 is formed between rows 172 and row 176. Aisles 180 and 182 are formed between the walls of computer room 162 and rows 172 and 176, respectively. Rack systems 170 and 174 include air directing devices 186.

To remove heat from servers in rack systems 170 and 174, air handling system 164 may be operated to cause air to flow in computer room 162 and through rack systems 170 and 174. Air may be forced into sub floor chamber 165 through opening 188. Air from subfloor chamber 165 may pass into computer room 162 through vents 190 and 192. Air from vent 190 may flow into aisle 180 and into rack systems 170 through the front side of row 172. Air from vent 192 may flow into aisle 178 and into rack systems 174 through the front side of row 176. Air may flow through servers in rack systems 170 and 174 and into air directing devices 186. Heated air in air directing devices 186 may be channeled through connecting ducts 200 to plenum 166. Air directing devices 186 on rack systems 170 of row 172 may segregate heated air exiting rack systems 170 from the air in aisle 178. Segregating exit air from air in aisle 178 may avoid pre-heating of air entering rack systems 174 in adjacent row 176.

Figure 11A:
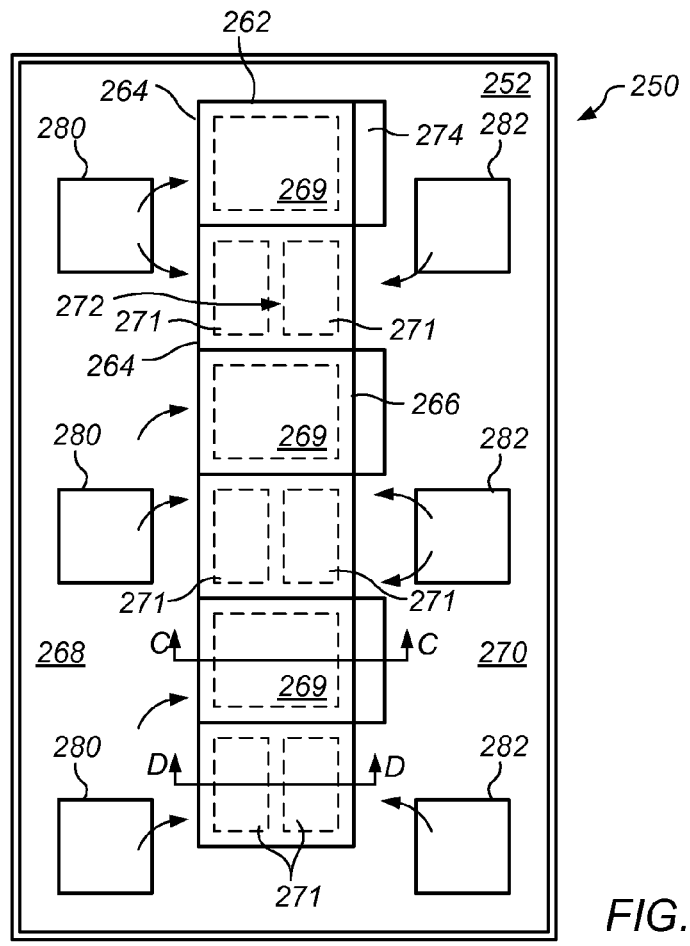
FIG. 11A a schematic top view illustrating one embodiment of a data center including a row of rack systems with two different airflow configurations.
Figure 11B:
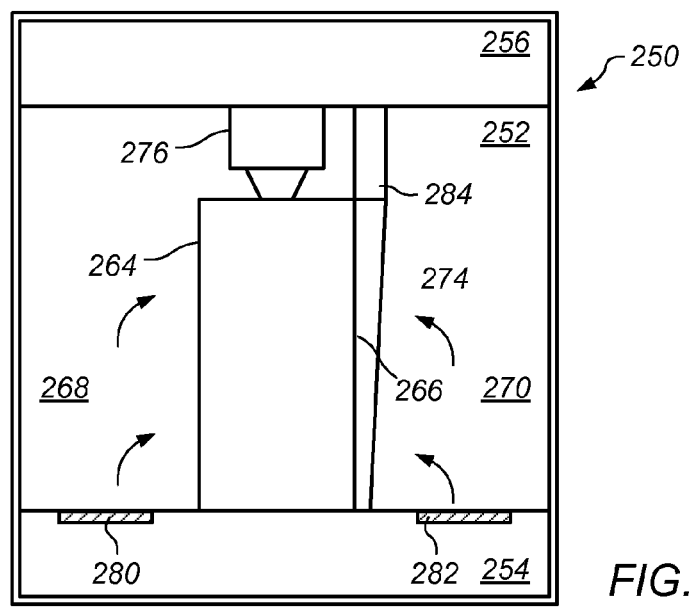
FIG. 11B a schematic end view illustrating one embodiment of a data center including a row of rack systems with two different airflow configurations.

In some embodiments, different rack systems in the same row have different airflow configurations. In certain embodiments, an air directing device segregates heated air exiting one rack system in a row from incoming air for other rack systems in the same row. FIG. 11A illustrates a schematic top view of one embodiment of a data center including a row of rack systems with two different airflow configurations. FIG. 11B illustrates a schematic end view of the data center shown in FIG. 11A. Data center 250 includes computer room 252, subfloor chamber 254, and plenum 256. Computer room 252 includes hot-cold rack systems 258 and cold-cold rack systems 260 in common row 262. In one embodiment, cold-cold rack system 260 is a half-depth server made by Rackable Systems, Inc. Row 262 includes front side 264 and back side 266. Row 262 separates front aisle 268 and back aisle 270.

Hot-cold rack systems 258 include full depth servers 269. One of air directing devices 274 is coupled to each of hot-cold rack systems 258 on backside 266 of row 262. Servers 269 in hot-cold rack systems 258 are cooled by passing air from front to back of row 262.

Cold-cold rack systems 260 include half depth servers 271. In each cold-cold rack system 260, mid column 272 is provided or formed in the space between the front stack of half depth servers 271 and the back stack of half depth servers 271. One of ducts 276 is coupled to each of cold-cold rack systems 260 above mid column 272. Servers 269 in cold-cold rack systems 260 are cooled by drawing air into rack system 260 on both the front and back of the rack system, and removing the air from mid column 272 through duct 276.

To remove heat from servers 269 and 271, an air handling system may be operated to cause air to flow from subfloor 254 to computer room 252 through front aisle floor vents 280 and back aisle floor vents 282. Air from front aisle floor vents 280 may pass from front aisle 268 into hot-cold rack systems 258 and cold-cold rack systems 260. Air from back aisle floor vents 282 may pass from front aisle 270 into cold-cold rack systems 260.

Figure 11C:
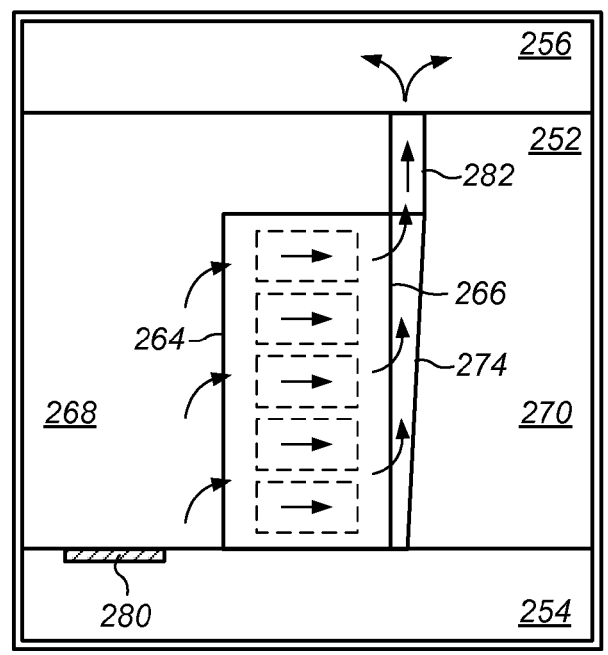
FIG. 11C illustrates removal of air from hot-cold rack systems.

The manner of removal of heated air from the rack systems in a row varies depending on the type of rack system. FIG. 11C illustrates removal of air from hot-cold rack systems shown in FIG. 11A. FIG. 11C may correspond diagrammatically to section lines C-C shown in FIG. 11A. Air drawn from front aisle 268 passes through servers 269, out the back of the rack system, and into air directing device 274. Air directing device 274 may direct heated air from the rack system into duct 284. Duct 284 may channel the heated air into plenum 256. Air directing device 274 and/or duct 284 may segregate heated air from servers 268 from air in back aisle 270, thereby avoiding cross-heating of the cooling air for cold-cold rack systems 260 that would occur if air discharged from hot-cold rack systems 258 were to mix with the air in back aisle 270.

Figure 11D:
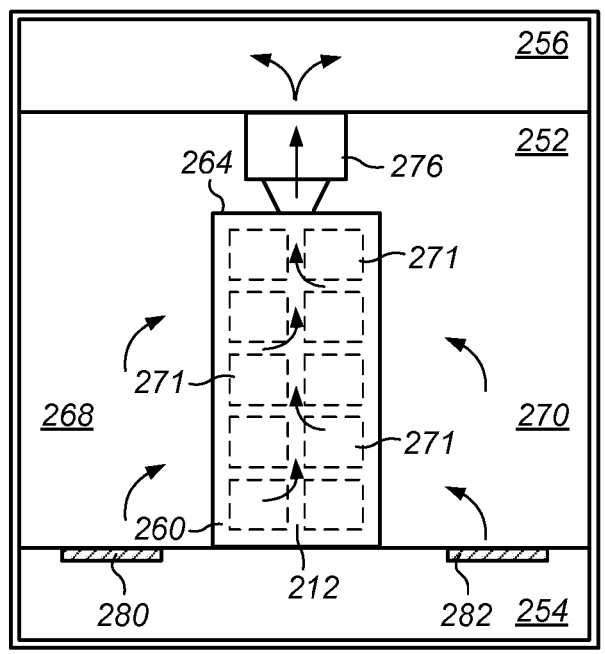
FIG. 11D illustrates removal of air from cold-cold rack systems.

FIG. 11D illustrates removal of air from cold-cold rack systems shown in FIG. 11A. FIG. 11D may correspond diagrammatically to section lines D-D shown in FIG. 11A. Air flows from the front side and back side of rack systems 260 through half depth servers 271 to mid column 272. Air in mid column 272 passes into duct 276, and then into plenum 256.

Figure 12A:
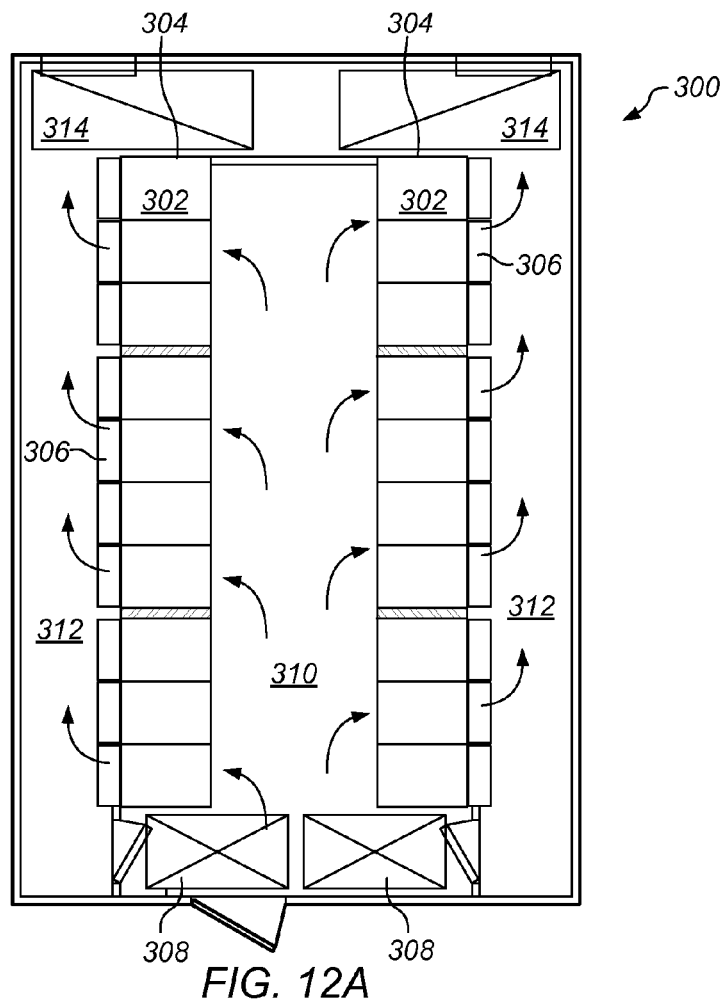
FIG. 12A is a schematic top view illustrating one embodiment of a data center including rack systems with a shared cold aisle.
Figure 12B:
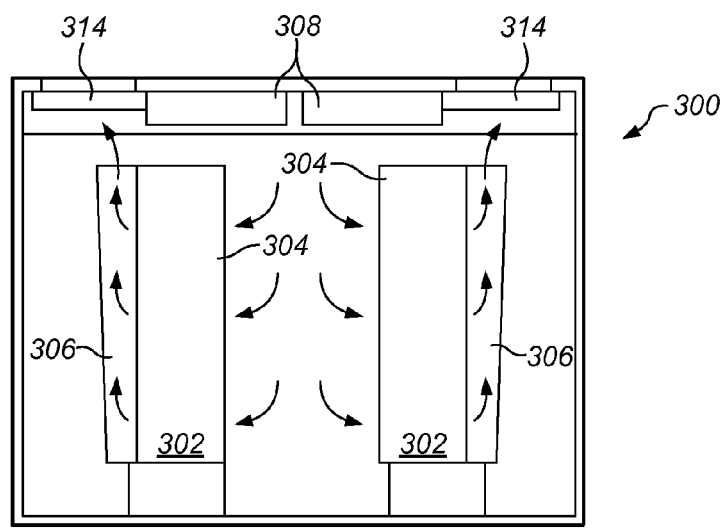
FIG. 12B is a schematic end view illustrating one embodiment of a data center including rack systems with a shared cold aisle.

In some embodiments of a data center, adjacent rows of a data center may receive cooling air from a shared aisle. FIG. 12A illustrates a schematic top view of one embodiment of a data center including rack systems with a shared aisle. FIG. 12B illustrates a schematic end view of the data center shown in FIG. 12A. Data center 300 includes rack systems 302 in rows 304. Air directing devices 306 are coupled to rack systems 302. An air handling system causes air to flow from supply vents 308 and into center aisle 310. Air from center aisle 310 flows into rack systems 302. Air directing devices 306 direct air exiting from rack systems 302 out through the tops of air directing devices 306. Return air vents 314 may draw air, including air discharged from air directing devices 306, out of data center 300.

In the embodiments shown in FIGS. 10A, 10B, 11A, 11C, 12A, and 12B, the air directing devices segregate air coming out of a rack from other air. In other embodiments, however, an air directing device may segregate air coming into a rack from other air, instead of, or in addition to, air directing devices segregating air exiting a rack. Directing discharge air from racks 302 toward the ceiling of the data center may minimize heating of air in aisle 306, and in the data center as a whole.

Figure 13:
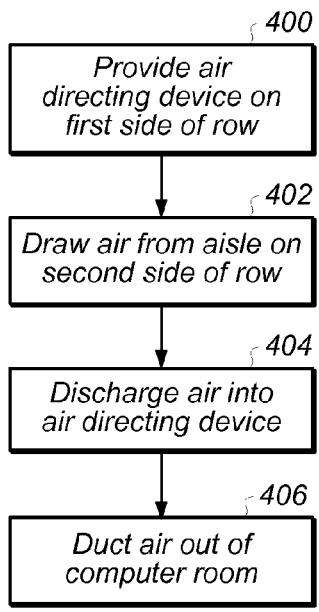
FIG. 13 is a flow diagram illustrating one embodiment of cooling rack systems in a computer room of a data center.

FIG. 13 illustrates one embodiment of cooling rack systems in a computer room of a data center. At 400, an air directing device having a louver is provided on a first side of a row of rack systems in a computer room. At 402, air is drawn into the rack system from an aisle on a second side of the row. At 404, air is discharged from the rack system into the air directing device. The discharged air may pass through the louver as it enters the air directing device. At 406, the air is ducted from the air directing device out of the computer room.

Figure 14:
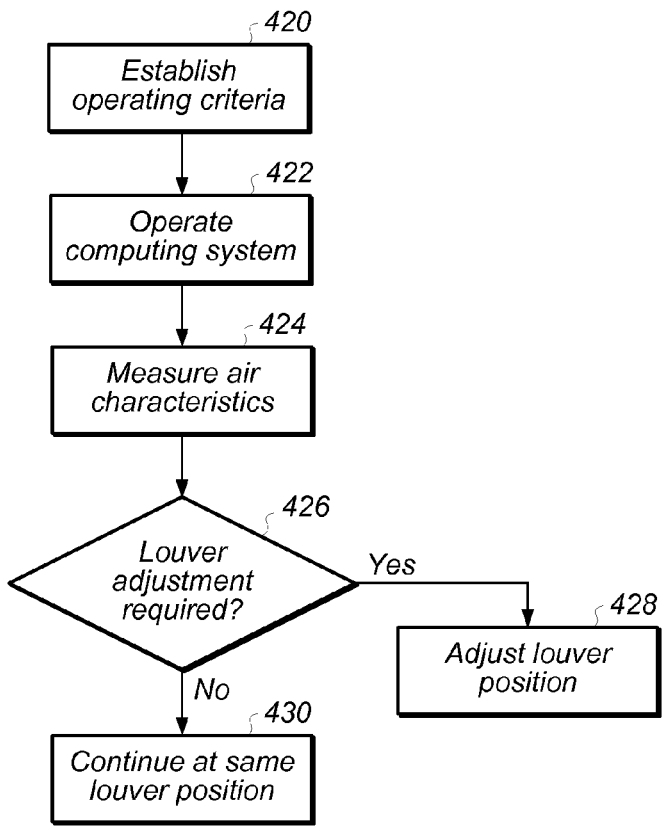
FIG. 14 is a flow diagram illustrating one embodiment of adjusting a louver of an air directing device for a rack system based on measured characteristics of air.

FIG. 14 illustrates one embodiment of adjusting a louver of an air directing device for a rack system based on measured characteristics of air. At 420, operating criteria for a rack-mounted computing system are established. The operating criteria may include, for example, a target operating temperature range for servers in the rack system.

At 422, the computing system is operated in a computer room. At 424, one or more characteristics of air in the computer room are measured while the system operates. In one embodiment, the measured characteristics include an airflow rate of air in the air directing device. In other embodiments, the measured characteristics include an airflow rate of air flowing through the rack, or a particular server in the rack. Other measured characteristics include temperature, pressure, or humidity of air in various locations.

At 426, a determination is made whether to adjust a louver in an air directing device based on the measured characteristics and the operating criteria. If the measured characteristics of air and the operating criteria indicate that an adjustment is required, airflow control members of the louver are adjusted at 428. For example, if the flow rate through the servers is too low, airflow control members in the louver may be moved to a more open position. If the measured characteristics of air and the operating criteria indicate that an adjustment is not required, operation is continued at the same louver position at 430. Adjustment of a louver of an air directing device may be accomplished manually, automatically, or a combination thereof.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computing system, comprising:
 a rack system comprising one or more computer systems, the rack system configured to allow air to flow into the rack system on a first side of the rack system and to allow air to discharge from the rack system on a second side of the rack system; and
 one or more air directing devices coupled to the rack system on at least one of the first side of the rack system or the second side of the rack system, at least one of the air directing devices comprising:
  a duct comprising one or more walls defining a duct passage, wherein the duct passage comprises an upwardly increasing interior cross section over at least a portion of the height of the duct, wherein the duct is configured to segregate air passing through the duct from air outside the duct; and
  a louver configured to couple to the rack system such that the louver is between air in the rack system and air in the duct passage, the louver comprising one or more airflow control members configurable to allow air to pass from the rack system into the duct passage by way of openings in the louver.

2. The computing system of claim 1, wherein the duct of the at least one air directing devices is configured to promote upward flow of air discharged from the rack system.

3. The computing system of claim 1, wherein the at least one air directing device further comprises an upper opening, wherein the duct of the at least one air directing device is configured to direct air discharged from the rack system to the upper opening.

4. The computing system of claim 1, wherein the at least one air directing device tapers from a smaller interior cross section at the bottom of the air directing device to a larger interior cross section at the top of the air directing device.

5. The computing system of claim 1, wherein, for at least one of the air directing devices, a ratio between the cross sectional area at the top of the duct and the cross sectional area at the bottom of the duct is about 2 to 1.

6. The computing system of claim 1, wherein at least portion of the duct of the at least one of the air directing device is made of fabric.

7. The computing system of claim 6, wherein the at least one air directing device further comprises boning coupled to the fabric, wherein at least a portion of the boning at least partially establishes a shape of the duct when the air directing device is installed on the rack system.

8. The computing system of claim 7, wherein at least a portion of the boning at least partially establishes an upwardly increasing cross section over at least a portion of the height of the duct when the air directing device is installed on the rack system.

9. An air directing device for directing air from or to a rack system, comprising:
 a louver; and
 a duct coupled to the louver, wherein the duct comprises one or more walls defining a duct passage, wherein the duct is configured to segregate air passing through the duct from air outside the duct wherein the louver is configured to couple to the rack system such that the louver is between air in the rack system and air in the duct passage, wherein the louver comprises one or more airflow control members configurable to allow air to pass from the rack system into the duct passage by way of openings in the louver.

10. The air directing device of claim 9, wherein the one or more airflow control members comprise two or more movable slats.

11. The air directing device of claim 9, wherein the louver comprises a frame, wherein at least one of the one or more airflow control members are adjustable relative to the frame.

12. The air directing device of claim 9, wherein louver is configurable to inhibit back flow into the rack over at least a portion of the height of the rack.

13. The air directing device of claim 9, wherein duct is configured to promote upward flow of air.

14. The air directing device of claim 9, further comprising an upper opening, wherein the duct is configured to direct the air from the louver to the upper opening.

15. The air directing device of claim 9, wherein at least part of the duct comprises an upwardly increasing interior cross section.

16. The air directing device of claim 9, wherein the louver comprises a frame, wherein the duct is configured to hang on the frame.

17. The air directing device of claim 9, wherein the duct comprises a door.

18. The air directing device of claim 9, wherein the louver comprises a frame, wherein the duct is hinged to the frame.

19. The air directing device of claim 9, wherein the louver comprises a first set of one or more airflow control members between the air in the rack system and the air in the duct passage, and a second set of one or more airflow control members above the first set of airflow control members and between the air in the rack system and the air in the duct passage, wherein the second set of airflow control members is independently adjustable from the first set of airflow control members.

20. The air directing device of claim 19, wherein a position and height of at least one of the sets of airflow control members substantially vertically aligns with a position and height of one or more slots for a computer system in the rack.

21. The air directing device of claim 9, wherein the louver comprises a frame comprising two or more holes, the air directing device further comprising at least one pin configured to engage in a selected one of the holes in the frame to constrain at least one of the airflow control members.

22. The air directing device of claim 9, wherein the louver comprises a frame comprising two or more holes, the air directing device further comprising:

a first pin configured to engage in a selected first one of the holes in the frame to constrain one of the one or more airflow control members on one side of the one airflow control member, and a second pin configured to engage in a selected second one of the holes in the frame to constrain the one airflow control member on the other side of the one airflow control member.

23. The air directing device of claim 9, further comprising a control system configured to control a position of at least one of the airflow control members.

24. The air directing device of claim 23, further comprising at least one sensor coupled to the control system, wherein the sensor is configured to measure at least one characteristic of air, wherein the control system is configured to control a position of at least one of the one or more airflow control members based on at least one measured characteristic of the air.

25. A data center, comprising:

a rack row comprising a first side and a second side and two or more rack systems comprising one or more computer systems, one or more air handling systems configured to move air through at least two of the rack systems in the rack row, wherein at least one of the rack systems in the rack row is configured to draw air from an aisle on the first side of the rack row when the one or more air handling systems are operated, wherein at least one other of the rack systems in the rack row is configured to discharge air on the first side of the rack row when the one or more air handling systems are operated; and at least one air directing device coupled, on the first side of the rack row, to at least one of the rack systems configured to discharge air on the first side of the rack row, wherein the at least one air directing device is configured to segregate air discharged from the at least one rack system from air in the aisle on the first side of the rack system.

26. The data center of claim 25, wherein at least one of the rack systems configured to draw air from the first side of the rack row is a cold-cold rack system.

27. The data center of claim 25, wherein at least one of the rack systems configured to discharge air on the first side is a hot-cold rack system, wherein at least one of the rack systems configured to draw air from the aisle on the first side of the rack row is a cold-cold rack system.

28. The data center of claim 25, wherein at least one of the rack systems configured to draw air from the aisle on the first side of the rack row is next to at least one rack system coupled to at least one of the air directing devices.

29. The data center of claim 25, wherein the first side of the rack row is the back side of the rack row, and the second side of the rack row is the front side of the rack row.

30. The data center of claim 25, wherein the at least one of the rack systems configured to discharge air on the first side of the rack row is configured to draw air from the second side of the rack row, wherein at least one of the rack systems configured draw air from the aisle on the first side is configured to discharge air between the first side and the second side.

31. The data center of claim 30, wherein the at least one rack system configured to discharge air between the first side and the second side is further configured to draw air from the second side of the rack row.

32. The data center of claim 25, further comprising at least one air directing device coupled, on the second side of the rack row, to at least one of the rack systems in the rack row, wherein at least one of the rack systems in the rack row is configured to draw air from an aisle on the second side of the rack row.

33. The data center of claim 25, further comprising a plenum outside of a room in which the rack row is located, wherein the plenum is configured to receive air from the at least one air directing device.

34. The data center of claim 33, further comprising a connecting duct between the at least one air directing device and the plenum, wherein the connecting duct is configured to channel air from the air directing device to the plenum.

* * * * *